(12) United States Patent
Baek et al.

(10) Patent No.: US 12,666,878 B2
(45) Date of Patent: Jun. 23, 2026

(54) HETEROJUNCTION SEMICONDUCTOR FLEXIBLE SUBSTRATE, MANUFACTURING METHOD THEREOF, AND ELECTRONIC DEVICE USING THE SAME

(71) Applicant: KOREA INSTITUTE OF SCIENCE AND TECHNOLOGY, Seoul (KR)

(72) Inventors: Seung Hyub Baek, Seoul (KR); Min Seok Kim, Seoul (KR); Ji-Soo Jang, Seoul (KR); Sunghoon Hur, Seoul (KR); Jungho Yoon, Seoul (KR); Hyun-Cheol Song, Seoul (KR); Seong Keun Kim, Seoul (KR); Ji-Won Choi, Seoul (KR); Jin Sang Kim, Seoul (KR); Chong Yun Kang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 358 days.

(21) Appl. No.: 18/511,720

(22) Filed: Nov. 16, 2023

(65) Prior Publication Data

US 2024/0180043 A1 May 30, 2024

(30) Foreign Application Priority Data

Nov. 29, 2022 (KR) ........................ 10-2022-0162246

(51) Int. Cl.
*H10N 30/072* (2023.01)
*H10N 39/00* (2023.01)

(52) U.S. Cl.
CPC .................................. *H10N 39/00* (2023.02)

(58) Field of Classification Search
CPC .... H10N 30/072; H10N 30/073; H10N 30/85; H10N 30/853; H10N 30/071; H10N 39/00
See application file for complete search history.

(56) References Cited

U.S. PATENT DOCUMENTS

| 2007/0054038 A1* | 3/2007 | Kijima | ............... H03H 9/02574 |
| | | | 428/615 |
| 2019/0072387 A1* | 3/2019 | Takayama | .......... H10N 30/8554 |
| 2020/0142396 A1* | 5/2020 | Youmans | ................ G01M 1/08 |

FOREIGN PATENT DOCUMENTS

| JP | 2006-279713 A | 10/2006 |
| JP | 2010-147088 A | 7/2010 |
| JP | 2017-50355 A | 3/2017 |
| KR | 10-1582247 B1 | 1/2016 |

OTHER PUBLICATIONS

Kaneko et al. "Effect of Buffer Layer on Epitaxial Growth of YSZ Deposited on Si Substrate by Slower Q-switched 266 nm YAG Laser" *Japanese Journal of Applied Physics*, vol. 43 No. 4A, 2004 (pp. 1532-1535).

* cited by examiner

*Primary Examiner* — Reema Patel
(74) *Attorney, Agent, or Firm* — NSIP Law

(57) ABSTRACT

Disclosed is a heterojunction semiconductor flexible substrate in which an epitaxial oxide thin film layer is hetero-bonded to a thinned silicon substrate using a metal layer, a manufacturing method thereof, and the heterojunction semiconductor flexible substrate can be applied to sensor, actuator, transducer, or micro electro mechanical systems (MEMS) device using high functionality of the epitaxial oxide thin film layer of high quality as well as an electronic and/or optical device.

10 Claims, 6 Drawing Sheets

Epitaxial growth

Surface flattening

Metal deposition

Patterning

Metal bonding

Selective etching

Remove Si

Bending

HETEROJUNCTION SEMICONDUCTOR FLEXIBLE SUBSTRATE, MANUFACTURING METHOD THEREOF, AND ELECTRONIC DEVICE USING THE SAME

CROSS-REFERENCE TO RELATED APPLICATION

This application claims priority to Korean Patent Application No. 10-2022-0162246, filed on Nov. 29, 2022, in the Korean Intellectual Property Office, the entire contents of which are hereby incorporated by reference.

BACKGROUND

1. Field

The present invention relates to a heterojunction semiconductor flexible substrate, a manufacturing method thereof, and an electronic device using the same, and more particularly to a first layered substrate is prepared by growing a sacrificial layer and an epitaxial oxide thin film having a perovskite structure by vacuum deposition on an oxide single crystal substrate, and then sequentially forming and patterning, the metal layer to prepare a second layered substrate having the metal layer formed on a separate silicon-on-insulator (SOI) substrate, A heterojunction semiconductor flexible substrate, a method of manufacturing the same, and an electronic device using the same, which comprises bonding the metal layer of the first layered substrate and the metal layer of the second layered substrate oppositely, removing the sacrificial layer of the first layered substrate after the bonding by etching, separating the oxide single crystal substrate, and etching and thinning the lower part of the SOI substrate of the second layered substrate after the separation.

2. Description of Related Art

Since an oxide composed by a combination of oxygen and one or more of metal ions has various kinds of functionality, it can be applied to devices, such as electric, electronic, magnetic, optical, energy and so on.

In general, a material property of the oxide is most excellent when it is in a single crystal form, and in case that this oxide of high quality is applied to a device, it is possible to develop an electronic instrument having epoch-making performance and skill that did not exist before.

Since most electronics industries have currently been accomplished based on silicon materials, it very highly needs skill for the combination of a functional oxide of high quality and a Si substrate.

The single crystal oxide is applied to a method of manufacturing a bulk single crystal using Bridgman's method or a solid-state single crystal growth method, and so on, and a method of manufacturing a single crystal thin film with the form of an epitaxial oxide thin film using a sputtering process, a chemical vapor deposition (CVD) process, a sol-gel process, and so on.

Meanwhile, in most electronics industries, since the development of technologies has been carried out on the basis of the development of devices of micro and nano scales, it is preferable that a functional oxide to be used has the form of a thin film, not bulk.

As a part of this effort, as disclosed in Non-Patent Document 1, it reports an effect of a buffer layer on epitaxial growth of yttria-stabilized zirconia (YSZ) deposited on $SiO_2/Si$ (001) substrate to be matched with a crystal structure of YSZ (001) shown after deposition of the YSZ buffer layer, and in addition to this, in order to form a functional oxide single crystal thin film on the Si substrate, the development of various buffer layers, such as YSZ, $SrTiO_3$, and so on has been carried out. However, it is problematic in that the grown epitaxial oxide thin film has very high defect density compared to that of a silicon single crystal due to a difference in crystal structure and combination feature of atoms.

Furthermore, it is very difficult to control a crystal orientation of the epitaxial oxide thin film through direct growth. For example, it is problematic in that it is impossible to deposit a perovskite functional oxide with an orientation of (110) plane or (111) plane on Si substrate of (001) plane using a direct growth method, or even if it is deposited, crystallinity is very poor.

Nevertheless, since material properties of the functional oxide are largely influenced by the crystal orientation, a technology to form a functional oxide having various orientations on a semiconductor substrate is very important.

Patent Document 1 discloses an invention relating to a method of manufacturing a semiconductor substrate and a method of manufacturing a semiconductor apparatus, and reports that it is possible to manufacture a semiconductor substrate having a single crystal semiconductor layer with favorable characteristics using a separation method with respect to the interface of a first single crystal semiconductor layer and a second single crystal semiconductor formed by a vapor-phase epitaxial growth method, although chemical mechanical process (CMP) treatment or heat treatment at a high temperature isn't necessarily performed.

In addition to this, although the other technologies of realizing the transcription of an epitaxial oxide thin film have ever been reported, only a process of manufacturing a thin film as a free-standing membrane by completely separating the thin film from a substrate has been reported. It is problematic in that the thin film membrane transferred to a hetero-substrate (a Si substrate, a glass substrate, and so on) is very weakly bonded to the substrate due to van der Waals' force, and it is difficult for the thin film membrane to perform a large-scale process.

However, in order to manufacture a device really, complete bonding of a Si substrate and a functional oxide thin film should be accomplished.

With this, the inventors of the present invention made efforts to solve the existing problems, and as a result, have accomplished the present invention devised from the result, which shows that it is possible to grow an epitaxial thin film of very high quality when growing a functional oxide having a similar crystal structure and physical property on an oxide single crystal substrate, by providing a semiconductor flexible substrate in which an epitaxial oxide thin film layer is bonded to a thinned silicon substrate via a metal layer in such a manner as to form a sacrificial layer and the epitaxial functional oxide thin film layer on the oxide single crystal substrate, to bond them onto a silicon-on-insulator (SOI) substrate, to carry out transcription and bonding by selectively etching only the sacrificial layer, and to further etch a lower part of the SOI substrate so as to be thin-filmed.

PRIOR ART DOCUMENT

Patent Document

Korean Patent No. 1582247 (Dec. 28, 2015)

Non-Patent Document

Japanese Journal of Applied Physics 2004, 43, 1532~1535.

SUMMARY

An object of the present invention is to provide a heterojunction semiconductor flexible substrate in which an epitaxial oxide thin film layer is hetero-bonded to a thinned silicon substrate (hereafter, referred to as "Si substrate") using a metal layer.

Another object of the present invention is to provide a method of manufacturing the heterojunction semiconductor flexible substrate.

The other object of the present invention is to provide an electronic device which is applicable to sensor, actuator, and MEMS device as well as the heterojunction semiconductor flexible substrate.

The present invention provides a heterojunction-based semiconductor flexible substrate in which an epitaxial oxide thin film layer is hetero-bonded to a thinned Si substrate using a metal layer, wherein the Si substrate is a substrate which is thin-filmed in such a manner as to etch a lower silicon layer and a buried oxide (BOX, $SiO_2$) layer of a silicon-on-insulator (SOI) substrate.

Preferably, a silicon-on-insulator substrate in which a complementary metal-oxide-semiconductor (CMOS) circuit is formed may be used in in the Si substrate, and as the Si substrate is thin-filmed by the lower silicon layer and the buried oxide (BOX, $SiO_2$) layer of the SOI substrate being etched, the semiconductor flexible substrate in which the epitaxial oxide thin film layer is hetero-bonded to one surface, in which the CMOS circuit is further formed on an upper part of the thinned Si substrate, via the metal layer is provided.

With respect to the semiconductor flexible substrate which is subjected to heterojunction, the epitaxial oxide thin film layer and the metal layer bond together in a structure of being patterned in a large number of lattice cells, so flexibility of the substrate may increase, and in the above fact, the epitaxial thin film layer comprises a piezoelectric oxide having a perovskite structure.

With respect to the heterojunction semiconductor flexible substrate, the metal layer may be formed in a single layer structure, or a layered structure composed of one element, or two or more of elements selected from a group consisting of Au, Al, W, Ti, Cr, Pt, Cu, Ni, Mo, Ta, Nb, and La, and it is more preferable that the metal layer has the layered structure.

The layered structure may be a structure like a layer of A/a layer of B/a layer of A' which shows that the layer of A, the layer of B, and the layer of A' are laminated in order, the layer of A and the layer of A' may be identical with or different from each other and may be any one selected from a group consisting of Ti, Cr, Cu, Ni, Pt, and Cr, and the layer of B may be any one selected from a group consisting of Au, Mo, Ta, Nb, La, W, and CuW.

When the metal layer may have the layered structure like the layer of A/the layer of B/the layer of A' which shows that the layer of A, the layer of B, and the layer of A' are laminated in order, the layer of A and the layer of A' each may consist of a metal adhesion layer having a thickness of 5 nm to 20 nm, and the layer of B may consist of a metal bonding layer having a thickness of 20 nm to 1 μm.

Also, with respect to the heterojunction semiconductor flexible substrate, a conductive metal oxide layer may further be formed between the epitaxial oxide thin film layer and the metal layer, wherein the conductive metal oxide layer may comprise metal which is able to form Schottky contact with the epitaxial oxide thin film layer, and the conductive metal oxide layer may be composed in amorphous or crystalline structure.

The present invention provides a method of manufacturing a heterojunction semiconductor flexible substrate, the method comprising: a step of preparing a first layered substrate by sequentially forming a sacrificial layer, an epitaxially grown oxide thin film layer having a perovskite structure, and a metal layer on an oxide single crystal substrate, and performing patterning; a step of preparing a second layered substrate by forming a metal layer on a silicon-on-insulator (SOI) substrate; a step of bonding the metal layer of the first layered substrate and the metal layer of the second layered substrate together to be face each other; a step of performing separation of the oxide single crystal substrate by etching the sacrificial layer of the first layered substrate after said bonding, and then removing it; and a step of etching, from the second layered substrate, a lower silicon layer and a buried oxide ($SiO_2$) layer of the SOI substrate after said separation so as to be thin-filmed.

The Si substrate in the step of preparing the second layered substrate may be a silicon-on-insulator (SOI) substrate in which a CMOS circuit is formed.

With respect to the manufacturing method of the present invention, when the heterojunction is performed, the second layered substrate comprising the SOI substrate, or the SOI substrate in which the CMOS circuit is formed may be located at a lower part, and the first layered substrate comprising the oxide single crystal substrate may be aligned at a desired position from an upper part.

With respect to the manufacturing method of the present invention, it is preferred that in a first layered step, the oxide single crystal substrate is surface treated such that the surface roughness of one surface or both surfaces thereof reaches 1 nm or less.

Furthermore, the present invention may provide an electronic device using the heterojunction semiconductor flexible substrate manufactured by the manufacturing method.

In the above fact, the semiconductor flexible substrate is advantageous for application to a curved surface because the metal layer and the oxide thin film layer in which a single crystal having a perovskite structure is epitaxially grown are patterned, so the heterojunction semiconductor flexible substrate may be applied to sensor, actuator, transducer, or micro-electromechanical systems (MEMS) device using high functionality which the epitaxial oxide thin film layer of high quality has as well as an electronic and/or optical device.

The present invention can provide a heterojunction semiconductor flexible substrate which is favorable for application to a curved surface as an epitaxial oxide thin film layer is hetero-bonded to a thinned Si substrate via a metal layer.

Also, the present invention can provide a method of manufacturing a heterojunction semiconductor flexible substrate, the method comprising growing a sacrificial layer, and an epitaxial functional oxide thin film of high quality on an oxide single crystal substrate, bonding them to a metal layer of a silicon-on-insulator (SOI) substrate, then etching the sacrificial layer selectively and carrying out separation of the oxide single crystal substrate, and etching a lower silicon layer of the SOI substrate, and a buried oxide ($SiO_2$) layer after the separation so as to be thin-filmed.

The heterojunction semiconductor flexible substrate obtained from the manufacturing method of the present invention is a semiconductor substrate which shows that the epitaxial oxide thin layer is bonded to the thinned Si substrate via a metal layer, and it is possible to perform a large scale of process accordingly as perfect bonding is carried out between the semiconductor substrate and the epitaxial oxide thin film layer.

Also, as a conductive metal oxide layer is further formed between the epitaxial oxide thin film layer and the metal layer, excellent bonding strength between the layers occurs, and a leakage current decrease so that dielectric breakdown can be controlled, and excellent dielectric characteristics, which cause ferroelectric performance to be maintained in spite of highly repeated polarization switching in an experiment for a fatigue of ferroelectrics, can be realized.

Also, in the case of the epitaxial oxide thin film layer, due to an interaction with the semiconductor substrate, it is easy to control a crystal orientation and a domain structure, and in particular, since the epitaxial oxide thin film layer comprises, a piezoelectric single crystal having a perovskite type crystal structure $ABO_3$, it is possible to manufacture sensors, actuators, transducers, or MEMS devices as well as electronic and electrical devices, and optical devices.

DETAILED DESCRIPTION

Hereinafter, the present invention is described in detail.

The present invention provides a heterojunction semiconductor flexible substrate in which an epitaxial oxide thin film layer is hetero-bonded to a thinned Si substrate using a metal layer, wherein the Si substrate, which is thin-filmed in such a manner as to etch a lower silicon layer and a buried oxide ($SiO_2$) of a silicon-on-insulator (SOI) substrate.

Figure 1:
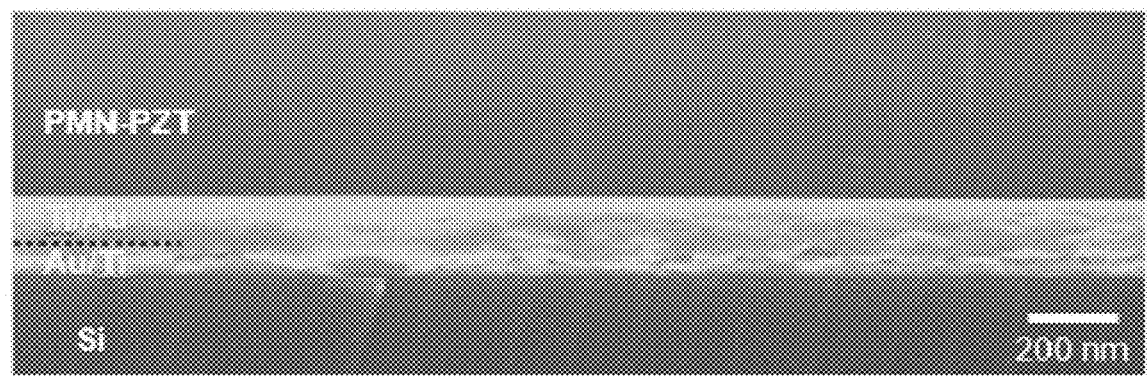
FIG. 1 is an image by a scanning electron microscope image of the section of a heterojunction semiconductor flexible substrate (PMN-PZT/Ti/Au/Ti/Si) according to the present invention.

FIG. 1 is an image by a scanning electron microscope image of a section of the heterojunction semiconductor flexible substrate (PMN-PZT/Ti/Au/Ti/Si) of the present invention, wherein it is confirmed that a metal layer consisting of a metal adhesion layer and a metal bonding layer is formed on the thinned Si substrate, and a bonding structure of the heterojunction semiconductor flexible substrate (PMN-PZT/Ti/Au/Ti/Si) comprising a PMN-PZT single crystal which is the epitaxial oxide thin film layer of high quality and which is disposed at an upper part thereof can be confirmed.

With respect to the semiconductor flexible substrate which is subjected to heterojunction junction according to the present invention, a silicon on insulator (SOI) substrate which can be adopted from general semiconductor substrate materials may be used in the Si substrate thin-filmed as described above, and with respect to a structure composed of the lower silicon layer having a thick thickness/the silicon oxide ($SiO_2$) layer of the buried oxide located in the middle/ an upper silicon layer having a thin thickness constituting the entire SIO substrate, it is characterized in that the lower silicon layer and the buried oxide ($SiO_2$) are thin-filmed by being etched.

According to the present invention, since a silicon on insulator (SOI) substrate in which a complementary metal-oxide semiconductor (CMOS) circuit is formed is used in the Si substrate, and the lower silicon layer and the buried oxide ($SiO_2$) of the SOI substrate are thin-filmed by etching, the heterojunction semiconductor flexible substrate in which the epitaxial oxide thin film layer is hetero-bonded to one surface, in which the CMOS circuit is further formed on an upper part of the thinned Si substrate, via the metal layer can ultimately be provided.

The heterojunction semiconductor flexible substrate of the present invention is advantageous for application to a curved surface because the metal layer, and the epitaxially grown oxide thin film layer bonded to the thinned Si substrate, are patterned.

The metal layer is formed in a single layer structure or a layered structure composed of one element, or two or more of elements selected from a group consisting of Au, Al, W, Ti, Cr, Pt, Cu, Ni, Mo, Ta, Nb, and La, and it is more preferable that the metal layer has the layered structure.

The layered structure is a structure of a layer of A/a layer of B/a layer of A' which shows that the layer of A, the layer of B, and the layer of A' are laminated in order, wherein the layer of A, and the layer of A' may be identical with each other or different from each other, and may be any one selected from a group consisting of Ti, Cr, Cu, Ni, Pt, and Cr, and the layer of B may be any one selected from a group consisting of Au, Mo, Ta, Nb, La, W, and CuW.

When the metal layer has the layered structure of the layer of A/the layer of B/the layer of A', the layer of A and the layer of A' are formed with a metal adhesion layer whose thickness ranges from 5 nm to 20 nm, and the layer of B is formed with a metal bonding layer whose thickness ranges from 20 nm to 1 μm.

With respect to the heterojunction semiconductor flexible substrate (PMN-PZT/Ti/Au/Ti/Si) of the present invention as shown in FIG. 1, although it is described that the metal layer has the layered structure formed in the form of Ti/Au/Ti, its structure should not be construed as being limited thereto.

More preferably, with respect to the heterojunction semiconductor flexible substrate, a conductive metal oxide layer may further be formed between the epitaxial oxide thin film layer and the metal layer.

Specifically, the heterojunction semiconductor flexible substrate is provided in such a structure that the metal layer formed on the thinned Si substrate, the conductive metal oxide layer, and the epitaxial oxide thin film layer bond together, wherein the metal layer, the conductive metal oxide layer, and the epitaxial oxide thin film layer are patterned in a large number of lattice cells.

Where, the conductive metal oxide layer has a conductive property and 5.0 eV or more of a work function value, and more preferably, it should be able to form an adjacent ferroelectric layer, and Schottky contact, not Ohmic contact. Due to this, a leakage current decreases so that dielectric breakdown can be controlled, and it is effective to control a ferroelectric fatigue thanks to the easy movement of oxygen vacancy between the ferroelectric and the conductive metal oxide layer. Also, since bonding strength between the conductive metal oxide layer and the ferroelectric layer is excellent, it is possible to realize a structure in which the ferroelectric layer is strongly combined with the semiconductor substrate.

The conductive metal oxide layer of the present invention may be formed of any one selected from a group consisting of SRO ($SrRuO_3$), $RuO_2$, and indium tin oxide (ITO), and may be layered in the state of amorphous or crystalline structure of those materials.

No thickness of the conductive metal oxide layer oxide layer requires to be thick because its purpose is interfacial control, and a lower limit of the thickness will be decided according to the roughness of a surface deposited. Although it is not required to limit the thickness specially, it may be formed in a range of 5 nm to 50 nm, preferably.

With respect to the heterojunction semiconductor flexible substrate of the present invention, in case that the epitaxial oxide thin film layer is measured in the mode of θ to 2θ of an X-ray diffractometer, it is found to be formed of a functional single crystal oxide of high quality having crystalline whose full width at half maximum is 0.3° or below when an omega (Ω) rocking curve aimed at a peak showing the highest diffraction peak intensity is measured.

Specifically, the single crystal oxide is a perovskite piezoelectric oxide whose lattice constant is 0.3 nm to 0.45 nm, and specifically, the perovskite piezoelectric oxide is composed of any one selected from a group consisting of $Pb(Mg_{1/3}, Nb_{2/3})O_3$, $PbZrO_3$, $PbTiO_3$, $SrTiO_3$, $SrRuO_3$, $BaTiO_3$, and $BiFeO_3$, or a solid solution thereof, or a material to which a dopant is added.

Detailed examples include PMN-PT $Pb(Mg_{1/3}, Nb_{2/3})O_3$, $PbZrO_3$), and PMN-PZT $Pb(Mg_{1/3}, Nb_{2/3})O_3$, $Pb(Zr,Ti)O_3$, and in particular, according to an exemplary embodiment of the present invention, although PMN-PZT($Pb(Mg_{1/3}Nb_{2/3})O_3$-$Pb(Zr,Ti)O_3$) is used and described, it is able to form the epitaxial oxide thin film of high quality by using the piezoelectric single crystal having a perovskite type crystalline structure ($ABO_3$) on the basis of a result showing that a PMZ-PZT thin film which is the epitaxial oxide thin film layer 30 is satisfactorily bonded to the semiconductor substrate through the metal layer.

With respect to the piezoelectric single crystal having the perovskite type crystal structure ($ABO_3$), a perovskite piezoelectric oxide ($[A][(MN)_{1-x-y} Ti_xZr_y]O_3$) containing zirconium (Zr) grown by a solid-state single crystal growth method may be used [widely known through Korean Patent No. 0743614]

In said formula, A represents at least one or more of elements selected from a group consisting of Pb, Sr, Ba, and Bi, M represents at least one or more of elements selected from a group consisting of Ce, Co, Fe, In, Mg, Mn, Ni, Sc, Yb, and Zn, N represents at least one or more of elements selected from a group consisting of Nb, Sb, Ta, and W, and x and y satisfy the following requisites, respectively:

0.05≤x≤0.58 (the mole fraction) and 0.05≤y≤0.62 (the mole fraction)

More preferably, in order to provide the epitaxial oxide thin film layer of high quality with respect to the heterojunction semiconductor flexible substrate of the present invention, the epitaxial oxide thin film layer is formed of a piezoelectric single crystal having a perovskite type crystal structure ($ABO_3$) expressed by the compositional formula of Chemical Formula 1 below:

$$[A_{1-(a+1.5b)}B_aC_b][(MN)_{1-x-y}(L)_yTi_x]O_3 \qquad \text{Chemical Formula 1}$$

in said formula, A represents Pb or Ba,

B represents at least one or more of elements selected from a group consisting of Ba, Ca, Co, Fe, Ni, Sn, and Sr C represents one or more of elements selected from a group consisting of Co, Fe, Bi, La, Ce, Pr, Nd, Pm, Sm, Eu, Gd, Tb, Dy, Ho, Er, Tm, Yb, and Lu, L represents a single form selected from Zr or Hf, or a mixed form thereof, M represents at least one or more of elements selected from a group consisting of Ce, Co, Fe, In, Mg, Mn, Ni, Sc, Yb, and Zn, N represents at least one or more of elements selected from a group consisting of Nb, Sb, Ta, and W, a, b, x, and y satisfy requisites of 0<a≤0.10, 0<b≤0.05, 0.05≤x≤0.58, 0.05≤y≤0.62, respectively.

Preferably, the piezoelectric single crystal satisfying the requisites of 0.01≤a≤0.10 and 0.01≤b≤0.05 in said formula is used, more preferably, satisfying the requisite of a/b≤2. At this time, in the above fact, when a is less than 0.01, it is problematic in that a perovskite phase is unstable, and when a exceeds 0.10, since a phase transition temperature gets too low, it is not preferable in that it becomes difficult to really use the single crystal.

Also, when no requisite of a/b≤2 is satisfied, it is not preferable because it is problematic in that dielectric and piezoelectric characteristics are not maximized, or growth of the single crystal is restricted.

Based on the fact that the piezoelectric characteristic of the piezoelectric single crystal of the perovskite type crystal structure ($ABO_3$) having the compositional formula of said Chemical Formula 1 trends toward increasing when chemical composition becomes complicated, with respect to the perovskite type crystal structure ($ABO_3$), ions located at [A] are composed by mixed composition of $[A_{1-(a+1.5b)}B_aC_b]$. The composition of A comprises a lead or lead-free element, and in the exemplary embodiment of the present invention, although it is described that the single crystal is limited to the piezoelectric single crystal in lead series which shows that A is Pb, it is not should be construed as being limited thereto.

At this time, with respect to the mixed composition of the ions located at [A] from the piezoelectric single crystal expressed by the compositional formula of Chemical Formula 1, in the case of the mixed composition in contrast to a case in which the composition is composed of a metal 3+ or a metal 2+ independently, an excellent dielectric constant may be realized.

The piezoelectric single crystal expressed by the compositional formula of Chemical Formula 1 comprises a metal 4+ element concerning the ion located at [B] from the perovskite type crystal structure ($ABO_3$), and in particular, the composition of L is limited to a single form selected from Zr or Hf, or a mixed form thereof.

Accordingly, according to the present invention, although the composition is complicated chemical composition using a solid-state single crystal growth method, the piezoelectric single crystal of uniform composition without composition gradient is used, and based on the mixed composition of the ions located at [A], the epitaxial oxide thin film layer is formed of the piezoelectric single crystal with dielectric characteristics, such as a high dielectric constant $K_3T$, high piezoelectric constants $d_{33}$ and $k_{33}$, high phase transition temperatures $T_C$ and $T_{RT}$, and a high coercive electric field $E_C$.

The epitaxial oxide thin film layer 30 according to the present invention comprises the perovskite piezoelectric oxide containing zirconium (Zr) grown by the solid-state single crystal growth method, and even though the perovskite piezoelectric oxide including a pore occurring in a process of the solid-state single crystal growth method is used, it is characteristic in that the epitaxial oxide thin film layer is formed into a thin film in which no pore exists.

Thickness of the thin film of the epitaxial oxide thin film layer described above may be formed to range from 0.4 μm to several tens of μm, more preferably, 10 μm or more.

At this time, the more the thickness of the epitaxial oxide thin film layer is thick the better because the thickness is fixed in such a manner as to cut the bulk single crystal in a wafer shape, and to perform polishing after bonding it to the semiconductor substrate. Accordingly, within the scope of the manner in progress, it is possible to form all allowable thicknesses in the light of time and economics, preferably, a thickness of 10 μm or more, and more preferably, a thickness of 10 μm to 50 μm.

Figure 2:
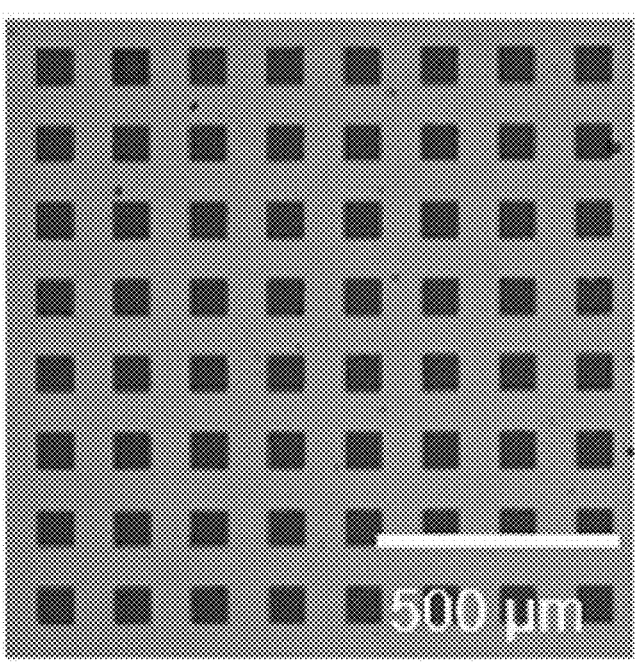
FIG. 2 is an optical image of the heterojunction semiconductor flexible substrate (PMN-PZT/Ti/Au/Ti/Si) according to the present invention.

FIG. 2 shows an optical image of the heterojunction semiconductor flexible substrate (PMN-PZT/Ti/Au/Ti/Si) of the present invention, and it is confirmed that the epitaxial oxide thin film layer is satisfactorily bonded to the Si substrate because the ground represents the thinned Si substrate, and the black-colored quadrilateral dots represent the epitaxial oxide thin layer patterned in a large number of lattice cells on the metal layer.

Figure 3:
FIG. 3 is one example for a character pattern using the heterojunction semiconductor flexible substrate according to the present invention.

FIG. 3 shows one example of a character pattern using the heterojunction semiconductor flexible substrate of the present invention, and when it is seen from a side of the STO (SrTiO$_3$) substrate which gets transparent by polishing both surfaces, a part that looks like dots corresponds to an island having the structure of Au/Ti/PMN-PZT/LSMO which is patterned on the STO substrate. Accordingly, based on the image shown in FIG. 3, since the STO substrate is transparent, paper characters on the back surface appear as they are, so it is supported that it is possible to realize a pattern and alignment of Au/Ti formed in the side of Si because the STO substrate is transparent.

Figure 4:
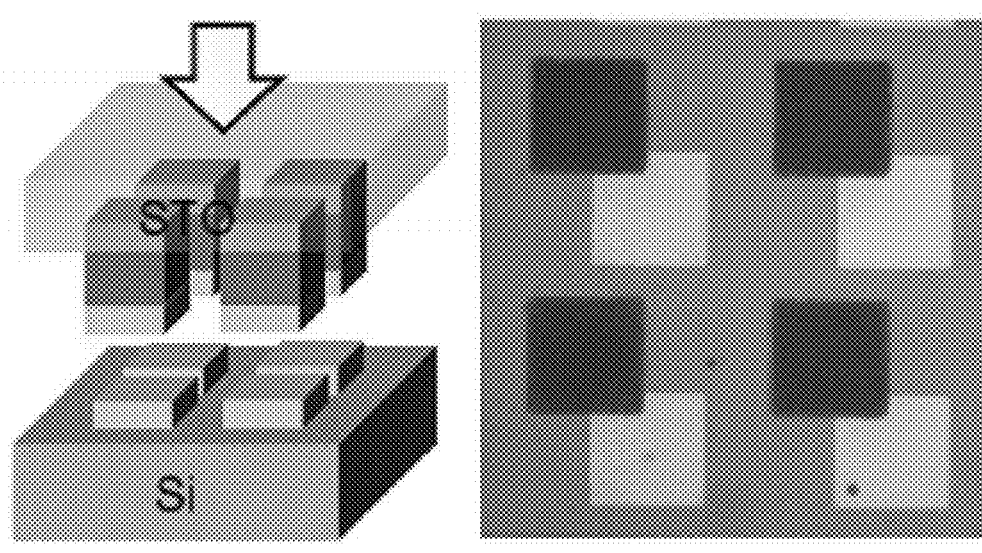
FIG. 4 is a mimetic diagram (the left side) showing that it is possible to carry out an alignment process among layers by utilizing transparency of a single crystal oxide substrate upon bonding of the heterojunction semiconductor flexible substrate (PMN-PZT/Ti/Au/Ti/Si) of the present invention, an optical image (the right side) from a front view.

Also, FIG. 4 is a mimetic diagram view (the left side) showing that it is possible to carry out an alignment process among layers by utilizing transparency of the single crystal oxide substrate upon bonding of the heterojunction semiconductor flexible substrate (PMN-PZT/Ti/Au/Ti/Si) of the present invention, and shows an optical image (the right side) from the front view.

Specifically, in the optical image on the right side of FIG. 4, the black-colored portion shows the structure of Au/Ti/PMN-PZT/LSMO patterned on the transparent STO substrate, the light gray-portion shows the pattern of Au/Ti formed on the Si substrate disposed at the lower part, and the gray-colored ground portion shows the surface of Si.

In order to describe the structure of the optical image, although the photograph of the image has been taken so that the pattern of the black-colored portion and the pattern of the light gray-portion slightly cross each other, the two patterns are actually aligned to be accurately consistent with each other, so that the bonding which follows after the alignment can be carried out.

In the exemplary embodiment of the present invention, STO (SrTiO$_3$) has been used in the oxide single crystal substrate without being limited thereto, and although no transparent STO appears in the optical image on the right side of FIG. 4, the layer patterned on STO is confirmed to be the black-colored quadrilateral. Accordingly, when bonding of a first layered substrate and a second layered substrate is carried out, those substrates are aligned at an accurate position, so the heterojunction semiconductor flexible substrate may be provided.

Also, the present invention provides a method of manufacturing a heterojunction semiconductor flexible substrate, the method comprising: 1) a step of preparing a first layered substrate by sequentially forming a sacrificial layer, an epitaxially grown oxide thin film layer having a perovskite structure, and a metal layer on an oxide single crystal substrate, and performing patterning; 2) a step of preparing a second layered substrate by forming a metal layer on a silicon-on-insulator (SOI) substrate; 3) a step of bonding the metal layer of the first layered substrate and the metal layer of the second layered substrate together to be face each other; 4) a step of performing separation of the oxide single crystal substrate by etching and removing the sacrificial layer of the first layered substrate after the bonding; and 5) a step of etching a lower silicon layer and a buried oxide (SiO$_2$) layer of the SOI substrate from the second layered substrate after said separation so as to be thin-filmed.

With respect to the manufacturing method of the present invention, in explanation about the first step of preparing the first layered substrate, the oxide single crystal substrate results from using a material having a perovskite structure, and when a functional oxide which is similar to it with respect to a crystal structure and physical properties grows on the oxide single crystal substrate, an epitaxial thin film of very high quality may grow. In the case of this epitaxial thin film, it is easy to control a crystal orientation and a domain structure due to an interaction with the substrate, and it is possible to carry out evaporation so as to realize more improved crystallinity than that of a bulk single crystal.

With respect to preferable one example of the oxide single crystal substrate, any one selected from a group consisting of SrTiO$_3$, DyScO$_3$, GdScO$_3$, TbScO$_3$, EuScO$_3$, SmScO$_3$, NdScO$_3$, PrScO$_3$, CeScO$_3$, LaScO$_3$, LaLuO$_3$, NdGaO$_3$, LaGaO$_3$, SrLaGaO$_4$, and LaAlO$_3$ may be used.

The epitaxial sacrificial layer may be formed on the oxide single crystal substrate using a vacuum evaporation process, and the functional epitaxial oxide thin film layer to be transferred may be formed on the epitaxial sacrificial layer. At this time, the epitaxial sacrificial layer and the epitaxial oxide thin film layer are formed using a process, such as sputtering, pulsed laser deposition (PLD), molecular beam epitaxial (MBE), chemical vapor deposition (CVD), an evaporator, and so on.

At this time, the epitaxial oxide thin film layer to be transferred is to be formed of a functional single crystal oxide of high quality having crystallinity whose full width at half maximum (FWHM) is 0.3° or below, resulting from measurement of an omega (Ω) rocking curve aimed at a peak at which diffraction peak intensity is most high, in case that the functional single crystal oxide is measured in the mode of θ-2θ of an X-ray diffractometer.

Specifically, the epitaxial oxide thin film layer is composed of a perovskite piezoelectric oxide whose lattice constant is 0.3 nm to 0.45 nm, and specifically, the perovskite piezoelectric oxide comprises any one selected from a group consisting of Pb(Mg$_{1/3}$, Nb$_{2/3}$)O$_3$, PbZrO$_3$, PbTiO$_3$, SrTiO$_3$, SrRuO$_3$, BaTiO$_3$, and BiFeO$_3$, or a solid solution thereof, or a material to which a dopant is added.

Detailed examples include PMN-PT(Pb(Mg$_{1/3}$Nb$_{2/3}$)O$_3$-PbTiO$_3$), and PMN-PZT(Pb(Mg$_{1/3}$Nb$_{2/3}$)O$_3$-Pb(Zr,Ti)O$_3$), and in particular, in the exemplary embodiment of the present invention, even though PMN-PZT(Pb(Mg$_{1/3}$Nb$_{2/3}$)O$_3$-Pb(Zr,Ti)O$_3$) is used and described, the epitaxial oxide thin film layer of high quality may be formed using a piezoelectric single crystal having a perovskite type crystal structure (ABO$_3$) based on a result which shows that a PMN-PZT thin film which is the epitaxial oxide thin film layer is satisfactorily bonded to the semiconductor substrate via the metal layer.

A perovskite e piezoelectric oxide ([A][(MN)$_{1-x-y}$Ti$_x$Zr$_y$]O$_3$) containing zirconium (Zr) grown by a solid-state growth method may be used in the piezoelectric single crystal having the perovskite type crystal structure (ABO$_3$) (well-known through Korean Patent No. 0743614).

In said formula, A represents at least one or more of elements selected from a group consisting of Pb, Sr, Ba, and Bi, M represents at least one or more of elements selected from a group consisting of Ce, Co, Fe, In, Mg, Mn, Ni, Sc, Yb, and Zn, N represents at least one or more of elements selected from a group consisting of Nb, Sb, Ta, and W, and x and y satisfy the following requisites:

0.05≤x≤0.58 (the mole fraction), 0.05≤y≤0.62 (the mole fraction).

With respect to the method of manufacturing the heterojunction semiconductor flexible substrate of the present invention, although the epitaxial oxide thin film layer has complicated chemical composition due to the solid-state single crystal growth method, the piezoelectric single crystal having uniform composition without compositional gradient is used, and based on the mixed composition of the ions located at [A], the epitaxial oxide thin film layer is formed of a piezoelectric single crystal with dielectric characteristics, such as a high dielectric constant K$_3$T, high piezoelectric constants d$_{33}$ and k$_{33}$, high phase transition temperatures T$_C$ and T$_{RT}$, and a high coercive electric field Ec.

The epitaxial oxide thin film layer according to the present invention comprises the perovskite piezoelectric oxide containing zirconium (Zr) grown by the solid-state single crystal growth method, and even though the perovskite piezoelectric oxide including a pore occurring in a process of the solid-state single crystal growth method is used, it is characteristic in that the epitaxial oxide thin film layer is formed into a thin film in which no pore exists.

The epitaxial oxide thin film layer according to the present invention satisfies the requisites, and the constitution used in the piezoelectric single crystal which constitutes the epitaxial oxide thin film layer is identical with the piezoelectric single crystal previously described with respect to the semiconductor flexible substrate which is subjected to heterojunction.

It is preferable that the thin film of the epitaxial oxide thin film layer has a thickness of 10 μm or more. At this time, the more the thickness of the epitaxial oxide thin film layer is thick the better because the thickness is fixed in such a manner as to cut the bulk single crystal in a wafer shape, and to carry out polishing after bonding it onto the semiconductor substrate. Accordingly, within the scope of the manner in progress, it is possible to form all allowable thicknesses in the light of time and economics, preferably, a thickness of 10 μm or more, and more preferably, a thickness of 10 μm to 50 μm.

After the epitaxial oxide thin film is formed, in order to realize surface polishing, chemical mechanical polishing (CMP) treatment may further be carried out.

After the treatment is carried out, a conductive metal oxide layer is formed on the epitaxial oxide thin film layer, and in the exemplary embodiment of the present invention, although it is described to be formed by a method of putting the conductive metal oxide layer in an amorphous state at the room temperature, without being limited thereto, the conductive metal oxide layer may be formed by evaporation in a crystalline structure state.

At this time, it is preferable that metal included in the conductive metal oxide layer is adopted from a material group showing higher work function than that of another metal of the metal layer adjacent thereto, and having a conductive characteristic. With respect to one example, any one selected from a group consisting of SRO (SrRuO$_3$), RuO$_2$, and an indium tin oxide (ITO) is used, and in the exemplary embodiment of the present invention, although it is described that SRO (SrRuO$_3$) is used, it should not be construed as being limited thereto.

After the conductive metal oxide layer is formed, the metal layer 20A may be formed by a method, such as sputtering, an evaporator, atomic layer deposition (ALD), CVD, and so on.

At this time, it is preferable that the oxide single crystal substrate is subjected to surface treatment which causes one surface or both surfaces thereof to have the surface roughness of 1 nm or less by chemical etching and thermal treatment so that it is advantageous to form an epitaxial film on an upper part of the oxide single crystal substrate.

Specifically, the metal layer may have a single layer structure or a layered structure composed of one element, or two or more of elements selected from a group consisting of Au, Al, W, Ti, Cr, Pt, Cu, Ni, Mo, Ta, Nb, and La.

The layered structure may be a structure of a layer of A/a layer of B/a layer of A' which shows that the layer of A, the layer of B, and the layer of A' are laminated in order, and the layer of A and the layer of A' are able to be identical with or different from each other, and are formed of any one selected from a group consisting of Ti, Cr, Cu, Ni, Pt, and Cr, and the B layer is formed of any one selected from a group consisting of Au, Mo, Ta, Nb, La, W, and CuW.

More particularly, the metal layer consists of a metal adhesion layer formed of any one selected from the group consisting of Ti, Cr, Cu, Ni, Pt, and Cr, and a metal bonding layer formed of any one selected from the group consisting of Au, Mo, Ta, Nb, La, W, and CuW which is evaporated on the metal adhesion layer.

After this, with respect to a first layered substrate formed as described above, a step of patterning the epitaxial oxide thin film layer and the metal layer formed on the single crystal substrate in a large number of lattice cells is performed.

At this time, with respect to the epitaxial oxide thin film layer, the functional epitaxial thin film may be made in the form of islands spaced apart from each other at a fixed distance using a wet etching method or a dry etching method, and this structure may be used for purposes of improving an etching speed of the sacrificial layer in the future or of isolation to control a mechanical and electrical mutual interference between each cell.

With respect to the manufacturing method of the present invention, the second step of preparing the second layered substrate is to form a metal layer on a silicon-on-insulator (SOI) substrate.

In the above fact, the SOI substrate is formed of a material which may be adopted from general semiconductor materials, and consists of a lower silicon (Si) layer having thick thickness/a silicon oxide (SiO$_2$) layer of a thin film type buried oxide (BOX) located in the middle/an upper silicon (Si) layer having thin thickness with respect to the whole SOI substrate.

Also, according to the present invention, another silicon-on-insulator (SOI) substrate in which a complementary metal-oxide semiconductor (CMOS) circuit is formed at an upper part of the SOI substrate described above is used, so the second layered substrate in which the metal layer is formed on the substrate may be prepared.

In general, in case that the epitaxial thin film grows directly on the Si substrate, since the growth is carried out by a process under a high temperature of 600° C. or more, it is impossible to apply the epitaxial thin film directly onto the Si substrate in which the CMOS circuit is already formed.

As transcription and bonding processes carried out with respect to the first layered substrate and the second layered substrate according to the manufacturing method of the present invention are mostly realized at the normal temperature, the second layered substrate, which is configured in such a manner that the metal layer is formed on the silicon-on-insulator (SOI) substrate in which the CMOS circuit is formed, may be located at an lower part, and bonding (integration) may be carried out in such a manner as to align the first layered substrate at a desired position from an upper part. At this time, the CMOS circuit functions to send a driving signal to the oxide layer, or to treat a signal which the oxide layer receives from an external stimulus.

With respect to the second layered substrate, the metal layer is the same as that formed in the first layered substrate.

In explanation about the metal layer with respect to the second layered substrate, the metal layer consists of a metal adhesion layer composed of any one selected from a group consisting of Ti, Cr, Cu, Ni, Pt, and Cr, and a metal bonding layer composed of any one selected from the group consisting of Au, Mo, Ta, Nb, La, W, and CuW which is deposited on the metal adhesion layer.

With respect to the metal layers formed in the first layered substrate and the second layered substrate, surface modification may further be performed using argon (Ar) or oxygen ($O_2$) plasma in order to remove an oxide layer or other contaminants which can be formed on surfaces of the metal layers after evaporation.

After this, with respect to the manufacturing method of the present invention, the third step is carried out in such a manner as to bond the metal layer of the first layered substrate and the metal layer of the second layered substrate together to be face each other.

Specifically, the metal layer of the first layered substrate and the metal layer of the second layered substrate are aligned at the same position by being set to be opposite to each other, namely, to face each other, so the metal layers bond together by bonding to apply pressure and heat thereto.

As illustrated in FIG. 3 and FIG. 4, two patterns of the layer of Au/Ti/PMN-PZT/LSMO patterned in the transparent STO substrate, and the layer of Au/Ti formed on the thinned Si substrate are aligned to be accurately consistent with each other, so it is possible to realize bonding.

The bonding means may apply pressure of 0.1 to 10 MPa for 10 to 20 seconds and heat having a temperature of 400° C. or below to the metal layers, and the heat may be adopted selectively. In order to increase efficiency of the bonding, if necessary, a process of removing impurities through Ar or $O_2$ plasma treatment intended for each of the metal bonding layers before applying the pressure thereto and activating each surface may be performed.

At this time, a bonding structure of the metal layers bonded after transcription may be formed in any one selected from a group consisting of Ti/Au/Ti, Cu/Mo/Cu, Ni/Mo/Ni, Cu/Ta/Cu, Ni/Ta/Ni, Cu/Nb/Cu, Ni/Nb/Ni, Cu/La/Cu, Ni/La/Ni, Cu/W/Cu, Ni/W/Ni, Cu/CuW/Cu, Ni/CuW/Ni, Pt/Au/Pt, Cr/Au/Cr, and Ti/Au/Pt. These layered structures are only described as preferable examples without being limited thereto, and may be combined with each other, and the layered structure may also include a symmetrical structure or an asymmetrical structure.

Also, when the metal layers bonded after transcription according to the present invention have a layered structure of a layer of A/a layer of B/a layer of A' which shows that the layer of A, the layer of B, and the layer of A' are laminated in order, the layer A and the layer A' each are formed with a metal adhesion layer having a thickness of 5 nm to 20 nm, and the layer B is formed with a metal bonding layer having a thickness of 20 nm to 1 μm.

It is preferable that a total thickness of the metal layers after transcription is formed in a range of 5 nm to 1500 nm.

The fourth step of the manufacturing method of the heterojunction semiconductor substrate according to the present invention is to produce the semiconductor flexible substrate to which the epitaxial oxide thin layer is bonded via the metal layer in such a manner as to put two substrates bonded as described above into an etching liquid and to perform separation of the oxide single crystal substrate by selectively etching and removing only the sacrificial layer of the first layered substrate.

At this time, the metal layers may be used to be a lower electrode according to a device, and the oxide single crystal substrate which has been separated may be reused.

After this, with respect to the manufacturing method of the present invention, the fifth step is to etch, from the second layered substrate, a lower part of the SOI substrate, or a lower part of the SOI substrate in which the CMOS circuit is formed, thereby realizing thinning.

At this time, since the SOI substrate, or the SOI substrate in which the CMOS circuit is formed may function as a substrate in which only the thin silicon (Si) layer of the upper layer remains in such a manner as to remove the thick silicon (Si) layer of the lower layer, and the silicon oxide ($SiO_2$) layer using the etching solution, flexibility of the substrate is provided.

Figure 5:
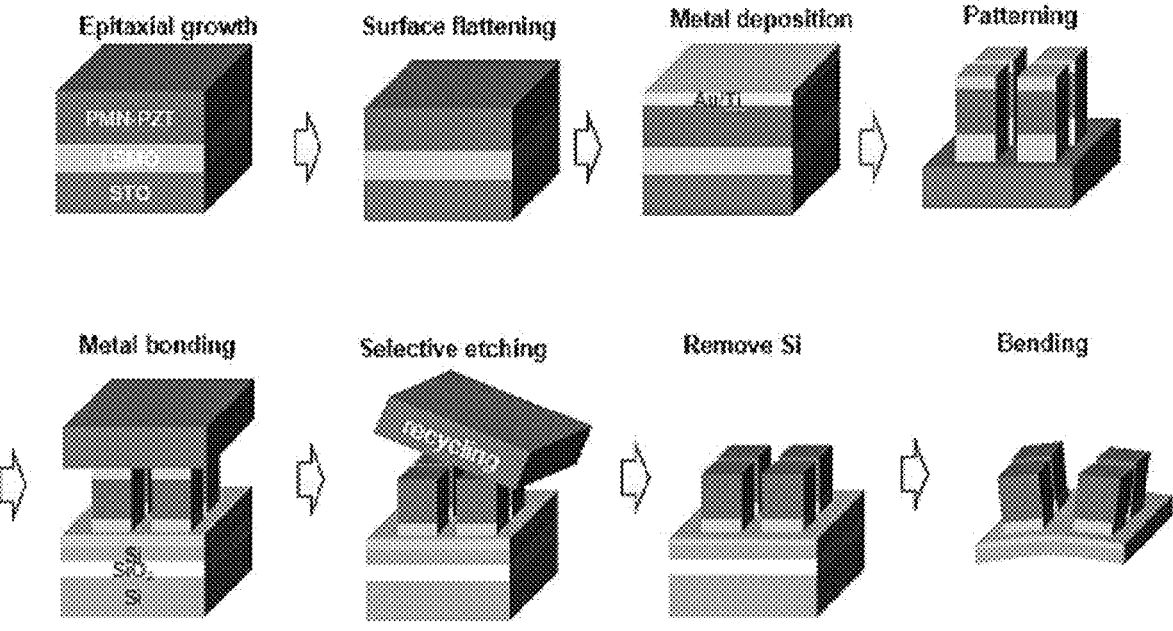
FIG. 5 illustrates a method of manufacturing the heterojunction semiconductor flexible substrate according to the present invention.

FIG. 5 illustrates the manufacturing method of the heterojunction semiconductor flexible substrate of the present invention. In specific explanation of the manufacturing method, a sacrificial layer, LSMO ($La_{0.67}$, $Sr_{0.33}$) $MnO_3$ of 50 nm grows into an epitaxial thin film on a single crystal substrate of $SrTiO_3$ through a PLD process, a layer of PMN-PZT of 1.2 μm grows into an epitaxial oxide thin film layer on the layer of LSMO through a sputtering process, and a CMP process is performed in order to reduce the surface roughness. After this, a Ti layer of 10 nm as a metal bonding layer, and an Au layer of 120 nm as a metal transcription layer are prepared by sequential growth through a vacuum evaporation (thermal evaporation) process.

The first layered substrate is prepared in such a manner as to form a photo resist (PR) pattern of 100×100 μm through a photolithographic process with respect to the epitaxial oxide thin layer and the metal layer (Au/Ti) formed on the single crystal substrate of $SrTiO_3$, and to carry out a process of etching the metal layer (Au/Ti) and the layer of PMN-PZT through a wet etching process so as to be patterned The second layered substrate is prepared in such a manner as to form another metal layer (Au/Ti) on the SOI substrate intended for transcription, or the SOI substrate in which the CMOS circuit is formed using a vacuum evaporation process, wherein the SOI substrate, or the SOI substrate in which the CMOS circuit is formed, and Au surface formed on the PMZ-PZT layer. The Si substrate and Au surface formed on the PMZ-PZT layer bond together after oxygen plasma treatment. 5 MPa of pressure is applied thereto for 15 minutes, and after completion of metal bonding, the specimen is put into a solution, the sacrificial layer of LSMO of the first layered is selectively etched so that the PMN-PZT layer is separated from the $SrTiO_3$ substrate, and is thus transferred to an upper part of the SOI substrate, or the SOI substrate in which the CMOS circuit is formed.

After this, the heterojunction semiconductor flexible substrate is manufactured in such a manner as to etch, from the second layered substrate, the lower part of the SOI substrate, or the SOI substrate in which the CMOS circuit is formed, thereby removing the thick silicon (Si) layer and the silicon oxide layer $(SiO_2)$ so as to be thin-filmed.

Figure 6:
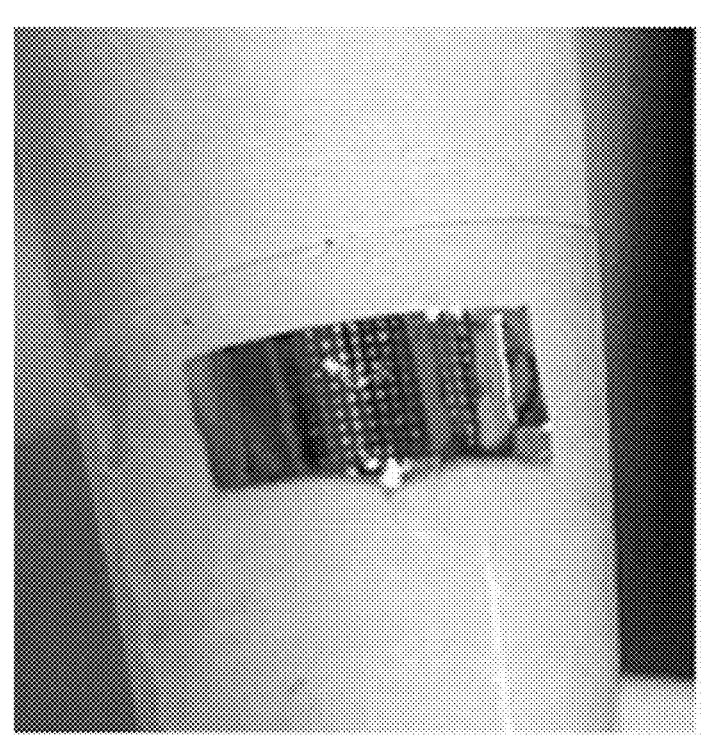
FIG. 6 shows one example in which an electronic device (a sensor) using the heterojunction semiconductor flexible substrate according to the present invention is applied to a curved surface.

Furthermore, the present invention provides the semiconductor flexible substrate in which the epitaxial oxide thin layer is hetero-bonded to the Si substrate thin-filmed by the manufacturing method as describe above, or onto the SOI substrate, in which the CMOS circuit is formed, via the metal layer, and also provides an electronic device comprising the heterojunction semiconductor flexible substrate FIG. 6 shows one example for an electronic device (sensor) using the heterojunction semiconductor flexible substrate of the present invention.

Thanks to a flexible character of the heterojunction semiconductor flexible substrate of the present invention, the present invention can be applied to a curved surface, and can also be applied to sensor, actuator, transducer, or MEMS device using high functionality of an epitaxial oxide thin film layer of high quality as well as an electronic and/or optical device.

As described above, although the detailed embodiments of the present invention have been disclosed and described for illustrative purposes, those skilled in the art will obviously appreciate that various variations and modifications are possible, within the scope of the technical spirit of the present invention, and it should be expected that these variations and modifications fall under the scope of the accompanying claims.

What is claimed is:

1. A heterojunction semiconductor flexible substrate in which an epitaxial oxide thin film layer is hetero-bonded to a thinned silicon substrate using a metal layer, wherein the silicon substrate is a substrate which is thin-filmed in such a manner as to etch a lower silicon layer and a buried oxide $(SiO_2)$ layer of a silicon-on-insulator (SOI) substrate, and wherein the silicon substrate is a silicon-on-insulator (SOI) substrate in which a CMOS circuit is formed.

2. The substrate of claim 1, wherein the epitaxial oxide thin film layer and the metal layer are patterned in a plurality of lattice cells.

3. The substrate of claim 1, wherein the epitaxial oxide thin film layer is a piezoelectric oxide having a perovskite structure.

4. The substrate of claim 1, wherein the metal layer has a single layer structure or a layered structure composed of one element, or two or more of elements selected from a group consisting of Au, Al, W, Ti, Cr, Pt, Cu, Ni, Mo, Ta, Nb, and La.

5. The substrate of claim 4, wherein the layered structure is a structure in which a layer A, a layer B, and a layer A' are laminated in order, the layer of A and the layer of A' are identical to or different from each other and are any one selected from the group consisting of Ti, Cr, Cu, Ni, Pt, and Cr, and the layer of B is any one selected from the group consisting of Au, Mo, Ta, Nb, La, W, and CuW.

6. The substrate of claim 5, wherein the metal layer has the layered structure of the layer of A, the layer of B, and the layer of A' that are laminated in order, the layer of A and the layer of A' each consist of a metal adhesion layer having a thickness of 5 nm to 20 nm, and the layer of B consists of a metal bonding layer having a thickness of 20 nm to 1 μm.

7. The substrate of claim 1, wherein a conductive metal oxide layer is further formed between the epitaxial oxide thin film layer and the metal layer.

8. The substrate of claim 7, wherein the conductive metal oxide layer comprises metal which is able to form Schottky contact with the epitaxial oxide thin film layer.

9. The substrate of claim 7, wherein the conductive metal oxide layer is amorphous or has a crystalline structure.

10. An electronic device comprising a heterojunction semiconductor flexible substrate of claim 1, which is applied to any one of a group selected from the group consisting of an electro-electronic device, optical device, sensor, actuator, transducer, and micro-electromechanical system (MEMS) device.

* * * * *